United States Patent
Shin et al.

(10) Patent No.: US 7,626,523 B2
(45) Date of Patent: Dec. 1, 2009

(54) DESERIALIZER, RELATED METHOD, AND CLOCK FREQUENCY DIVIDER

(75) Inventors: Min-Bo Shin, Suwon-si (KR); Hitoshi Okamura, Seongnam-si (KR); Sang-Jun Hwang, Gwanak-gu (KR)

(73) Assignee: Samsung Electronics Co., Ltd., Suwon-si, Geyonggi-do (KR)

( * ) Notice: Subject to any disclaimer, the term of this patent is extended or adjusted under 35 U.S.C. 154(b) by 0 days.

(21) Appl. No.: 11/972,037

(22) Filed: Jan. 10, 2008

(65) Prior Publication Data

US 2008/0169946 A1  Jul. 17, 2008

(30) Foreign Application Priority Data

Jan. 11, 2007  (KR) .................... 10-2007-0003446

(51) Int. Cl.
*H03M 9/00* (2006.01)

(52) U.S. Cl. ....................... 341/101; 341/100

(58) Field of Classification Search ............... 341/100, 341/101, 141; 326/39; 375/368
See application file for complete search history.

(56) References Cited

U.S. PATENT DOCUMENTS

| 6,535,527 | B1 | 3/2003 | Duffy | |
|---|---|---|---|---|
| 6,594,275 | B1* | 7/2003 | Schneider | 370/465 |
| 6,862,296 | B1 | 3/2005 | Desai | |
| 7,005,898 | B2 | 2/2006 | Tam et al. | |
| 7,039,787 | B1 | 5/2006 | Venkata et al. | |
| 7,457,323 | B2* | 11/2008 | Kawashima | 370/517 |
| 2006/0050819 | A1* | 3/2006 | Van Houdt et al. | 375/354 |
| 2006/0109929 | A1* | 5/2006 | Tripathi | 375/272 |
| 2006/0227916 | A1* | 10/2006 | Masui et al. | 375/355 |

FOREIGN PATENT DOCUMENTS

JP  2004135337 A  4/2004

* cited by examiner

*Primary Examiner*—Peguy JeanPierre
(74) *Attorney, Agent, or Firm*—Volentine & Whitt, PLLC

(57) ABSTRACT

A deserializer and method for deserializing data are disclosed. The method includes converting data from a serial data domain to a parallel data domain, detecting a comma related to the parallel data while the data is in the serial data domain, wherein conversion of the data from the serial data domain to the parallel data domain is made in relation to detection of the comma.

16 Claims, 14 Drawing Sheets

DESERIALIZER, RELATED METHOD, AND CLOCK FREQUENCY DIVIDER

CROSS-REFERENCE TO RELATED APPLICATIONS

This U.S. non-provisional patent application claims priority under 35 U.S.C. § 119 to Korean Patent Application No. 10-2007-0003446 filed on Jan. 11, 2007, the subject matter of which is hereby incorporated by reference.

BACKGROUND OF THE INVENTION

1. Field of the Invention

The present invention relates generally to serializer/deserializer circuitry (SerDes or SERDES) and related methods of data transmission. More particularly, the invention relates to a deserializer adapted for use within SerDes and having reduced data latency.

2. Description of Related Art

The term "SerDes" refers to a broad class of transceiver equipment and related methods of operation commonly used to transmit/receive data via high-speed serial links. In addition to other data communication systems, SerDes is being widely employed within semiconductor integrated circuit based system communicating higher bandwidth data. As part of its general functionality, SerDes routinely converts signal formed by parallel arrangements of data bits (i.e., "parallel signals") to/from signals formed by serial arrangements of data bits (i.e., "serial signals"). As such, SerDes typically includes a serializer and a deserializer. Generally speaking, a serializer is a device configured to convert a parallel signal into a serial signal, and a deserializer is a device configured to convert a serial signal into a parallel signal.

Figure (FIG.) 1 is a block diagram of a data system incorporating SerDes. Referring to FIG. 1, data system 1 generally comprises SerDes 10, link layer 20 (e.g., an Application Specific Integrated Circuit or ASIC), and a host 30. Host 30 and link layer 20 are connected through SerDes 10 to facilitate the communication of large volumes of data (i.e., high bandwidth data).

SerDes 10 comprises a deserializer 100 and a serializer 200. Deserializer 100 receives serial data at a relatively high rate (i.e., "high-frequency data" or SDATA) from host 30, converts the high-frequency serial data into N-bit wide parallel data, where N is an integer greater than one, and then transfers the N-bit parallel data to link layer 20. In contrast, serializer 200 receives N-bit parallel data from link layer 20, converts it into high-frequency serial data, and then transfers the high-frequency serial data to host 30. In one conventional example, serializer 200 may be used to serialize 10-bit parallel data encoded using an 8B10B protocol and received from link layer 20.

FIG. 2 is a block diagram further illustrating deserializer 100 of FIG. 1. Referring to FIG. 2, deserializer 100 includes a parallel converter 1000 and a data aligner 2000. Parallel converter 1000 generates (or "recovers") preliminary N-bit parallel data RXD' from received high-frequency serial data, as well as a clock signal associated with the high-frequency serial data. Data aligner 2000 then performs data alignment to generate N-bit parallel data RXD by detecting a so-called comma (K28.5) from the recovered parallel data. Here, data aligner 2000 includes a comma detector 2200 generating a comma detection signal CDET.

FIG. 3 further illustrates an exemplary data alignment approach operatively within deserializer 100 which assumes the recovery of 10-bit parallel data by parallel converter 1000.

In the illustrated example, the detected comma is a 7 bit data value while unit data byte size is defined as 10 bits. As deserializer 100 temporally aligns bytes of data (and bits within each byte of data) to restore the N-bit parallel data RXD, comma detector 2200 operates to detect a comma by checking 7 bit wide data groups. This may be accomplished by shifting bit for bit through a first byte to a second byte, etc. Comma detector 2200 generates the detection signal CDET upon detecting a comma. Data aligner 2000 operates to properly align the restored N-bit parallel data RXD in response to the detection signal CDET.

Under the foregoing assumptions, it is generally preferred that a maximum delay time for the recovery of N-bit parallel data be no longer than 6 transmission words (e.g., 240 bits). This preference arises from certain conditions associated with FC-AL monitoring or state arbitration processes. In the illustrated example of FIGS. 1-3, a delay time for each transmission word is a function of the time required to serialize/deserialize data within SerDes 20. Thus, data latency or the period required to pass data through the serialize/deserialize process is a critical system performance parameter. Reduction of data latency while ensuring accurate data recovery within a data deserializer is a highly desirable design objective.

SUMMARY OF THE INVENTION

In one embodiment, the invention provides a deserializer having reduced data latency and a related method of deserializing data. In another embodiment, the invention provides a deserializer and related method generating N-bit parallel data while removing glitches from one or more recovery clocks associated with N-bit parallel data. In another embodiment, the invention provides a deserializer that accurately aligns serial data by detecting a comma.

In one embodiment, the invention provides a deserializer comprising; a first parallel converter configured to convert serial data into a plurality of serial data groups, a second parallel converter configured to receive and convert the plurality of serial data groups into preliminary N-bit parallel data, where N is an integer greater than 1, a comma detector configured to detect a comma associated with the plurality of serial data groups during conversion of the plurality of serial data group into the preliminary N-bit parallel data and generate corresponding comma detection signals, and a data aligner configured to align the preliminary N-bit parallel data into N-bit parallel data in relation to the comma detection signals.

In another embodiment, the invention provides a method for deserializing data in a deserializer, comprising; converting serial data into a plurality of serial data groups, parallelizing the plurality of serial data groups to generate preliminary N-bit parallel data, where N is an integer greater than 1, and aligning the preliminary N-bit parallel data to form N-bit parallel data generated by the deserializer while parallelizing the plurality of serial data groups.

In another embodiment, the invention provides a method of deserializing data in a deserializer, comprising; converting data from a serial data domain to a parallel data domain, detecting a comma related to the parallel data while the data is in the serial data domain, wherein conversion of the data from the serial data domain to the parallel data domain is made in relation to detection of the comma.

BRIEF DESCRIPTION OF THE FIGURES

FIGS. 12A through 12D, illustrates four exemplary comma patterns that may used in the operation of the deserializer of FIG. 4 according to one embodiment of the invention;

DESCRIPTION OF EMBODIMENTS

Embodiments of the invention will now be described in some additional detail with reference to the accompanying drawings. The present invention may, however, be embodied in different forms and should not be constructed as being limited to only the illustrated embodiments. Rather, these embodiments are presented as teaching examples. Throughout the drawings and written description, like reference numbers and symbols refer to like or similar elements, circuits, signals, etc.

Figure 1:
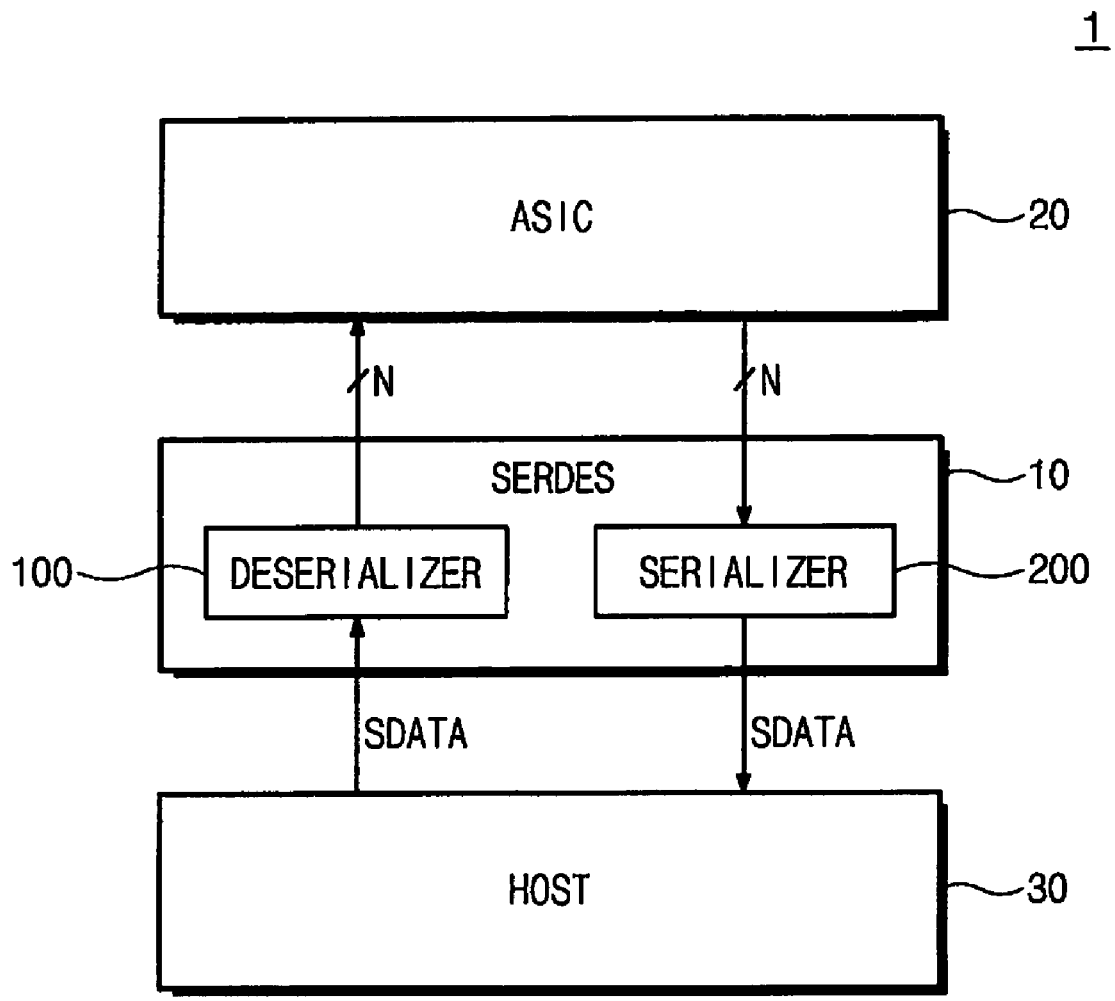
FIG. 1 is a block diagram of a conventional data system incorporating SerDes.
Figure 2:
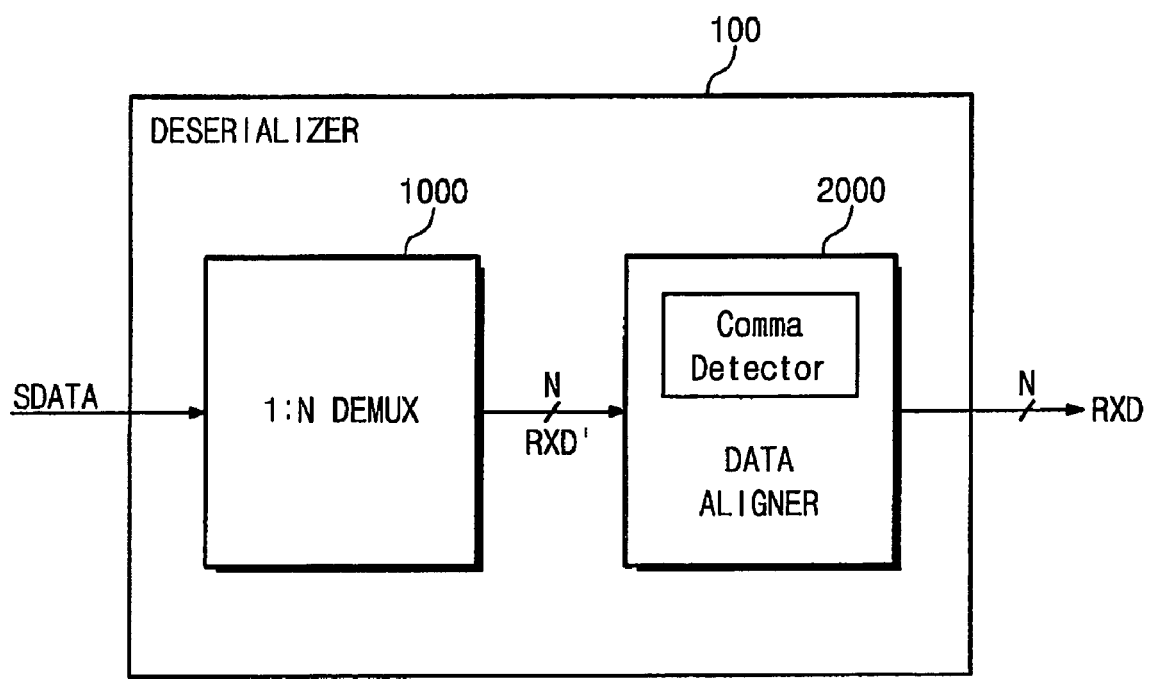
FIG. 2 is a block diagram further illustrating the deserializer of FIG. 1.
Figure 3:
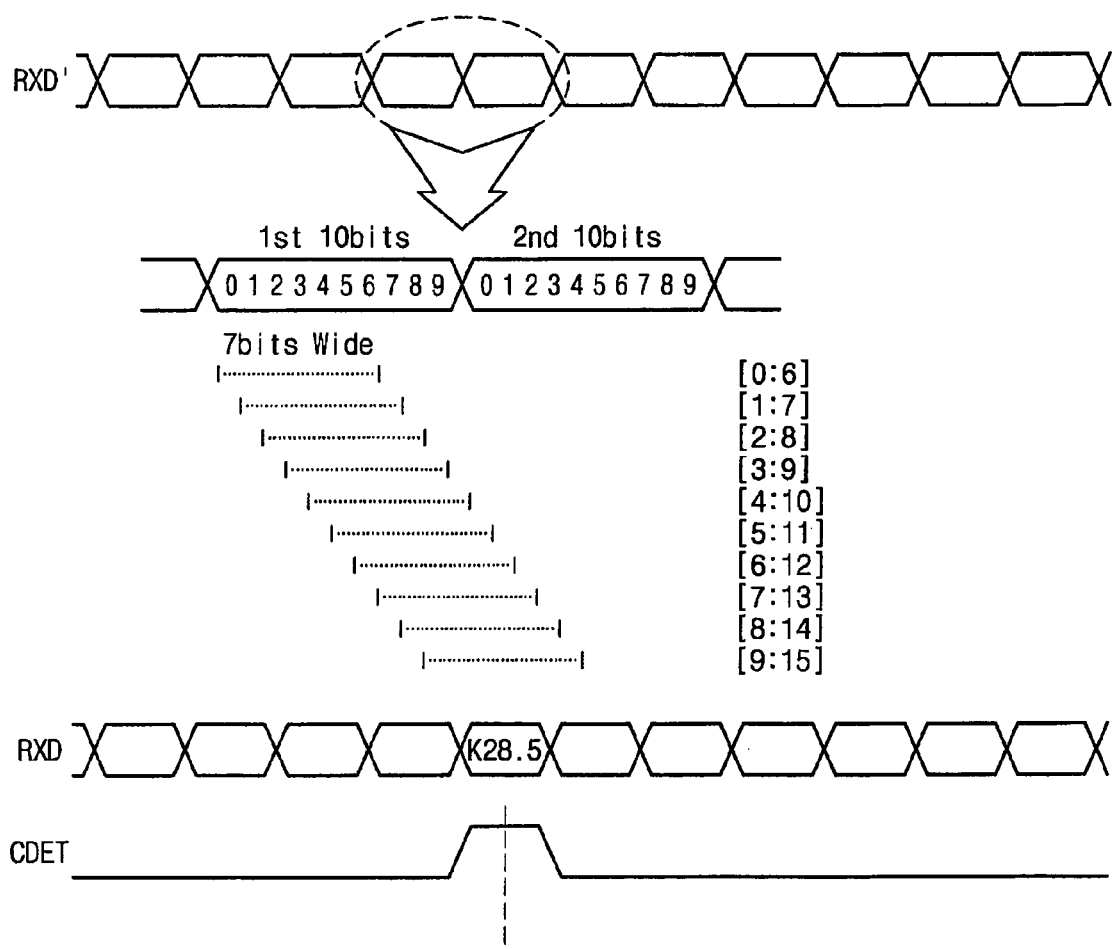
FIG. 3 illustrates an exemplary method for aligning data within the deserializer of FIGS. 1 and 2.
Figure 4:
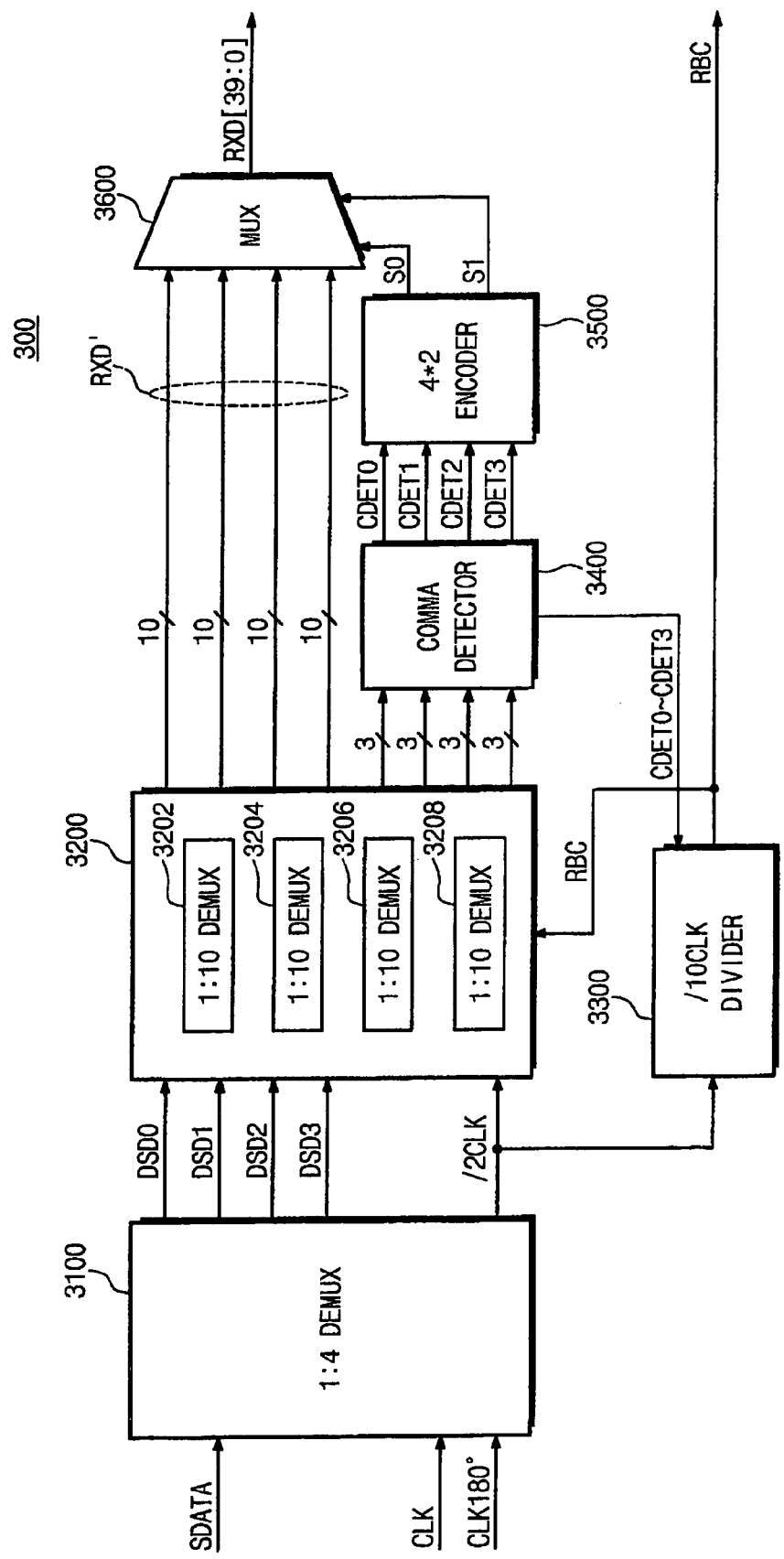
FIG. 4 is a block diagram of a deserializer according to an embodiment of the invention.

FIG. 4 is a block diagram of a deserializer operative within a general data system such as the one described in relation to FIG. 1 and configured in accordance with an embodiment of the invention. Referring to FIG. 4, deserializer 300 comprises of a first parallel converter 3100, a second parallel converter 3200, a clock frequency converter 3300, a comma detector 3400, an encoder 3500, and a selector 3600. In certain embodiments of the invention encoder 3500 and selector 3600 will be collectively referred to as a data aligner. As illustrated in FIG. 4, deserializer 300 receives serial data SDATA and generates N-bit parallel data RXD [39:0], where N is equal to 40 (or a 40 bit data word) in the working example, and a receiving-byte clock RBC associated with the N-bit parallel data.

Within deserializer 300, first parallel converter 3100 is configured to convert the serial data SDATA into "P" M-bit serial data groups DSD0~DSD3 in response to an externally provided main clock signal CLK and a complementary clock signal CLK180, where P is equal to four and M is equal to 10.

In the illustrated example, the phase of complementary clock CLK180 is assumed to be later than that of the main clock CLK.

First parallel converter 3100 outputs the serial data groups DSD0~DSD3 to second parallel converter 3200 in response to a first clock /2CLK. In the illustrated example, the first clock /2CLK is assumed to have a period one half that of the main clock CLK. Further, in the illustrated example of FIGS. 4 and 5, first parallel converter 3100 is implemented using a 1:4 demultiplexer, but other circuitry may be used to similar effect.

Second parallel converter 3200 is configured to further convert the serial data groups DSD0~DSD3 received from first parallel converter 3100 into 10-bit parallel data. The further conversion of the serial data groups DSD0~DSD3 proceeds on a data group by data group basis in relation to the first clock /2CLK. In this manner, second parallel converter 3200 generates P streams of non-aligned M-bit parallel data (or collectively "preliminary N-bit parallel data", or RXD').

Second parallel converter 3200 communicates the 40-bit parallel data RXD' to selector 3600 in relation to a second clock RBC provided by clock frequency divider 3300. In the illustrated example, second clock RBC is assumed to have ⅒ the period of the first clock /2CLK. Further in the illustrated example, second parallel converter 3200 is implemented using a plurality of 1:M demultiplexers 3202~3208. Demultiplexers 3202~3208 respectively convert the serial data groups DSD0~DSD3 received from first parallel converters 3100 into M-bit parallel data.

Clock frequency divider 3300 receives the first clock /2CLK from first parallel converter 3100 and derives the second clock RBC from it. In the illustrated example, the indicator "RBC" associated with the second clock is an abbreviation for Receiving-Byte Clock. This second clock RBC is output from deserializer 300 along with the N-Bit parallel data.

Comma detector 3400 is provided to detect a comma associated with the preliminary N-bit parallel data. In the illustrated example, comma detector 3100 is configured to detect a comma in relation to the higher 3-bits of data output from each one of the plurality of demultiplexers 3202~3208. In response, comma detector 3400 generates comma detection signals CDET0~CDET3.

Encoder 3500 generates selection signals S0 and S1 in response to the detection signals CDET0~CDET3 received from comma detector 3400.

Selector 3600 accurately align data bits within and in relation to the P streams of M-bit parallel data provided by second parallel converter 3200 in response to the selection signals S0 and S1 received from encoder 3500. Accordingly, selector 3600 generates aligned N-bit parallel data RXD.

Deserializer 300 according to the illustrated embodiment of the invention converts the serial data SDATA into N-bit parallel data. At the same time, deserializer 300 aligns the N-bit parallel data in response to selection signals derived from comma detection signals.

Conventional deserializers, like the one described in relation to FIG. 1, align data within N-bit parallel data only after converting serial data into the N-bit parallel data within a parallel converter. In other words, the conventional deserializer performs data alignment by detecting a comma from restored N-bit parallel data. Hence, the conventional deserializer aligns data in a unit byte size in accordance with a detected comma.

In contrast, deserializer 300 of the illustrated embodiment of the invention performs data alignment while converting the serial data SDATA into N-bit parallel data. That is, deserializer 300 recovers data in relation to a unit word size (e.g., 40 bits). Since deserializer 300 detects a comma within the "serial data domain" so to speak, rather than the "parallel data domain" which is conventional, data alignment may be performed on a unit word size basis (40 bits), thereby reducing overall data latency associated with operation of the deserializer. To summarize these aspects of the illustrated embodiment, deserializer 300 generates N-bit parallel data by aligning data in the serial data domain. Further, deserializer 300 aligns the N-bit parallel data in relation to a unit word size of N bits.

Figure 5:
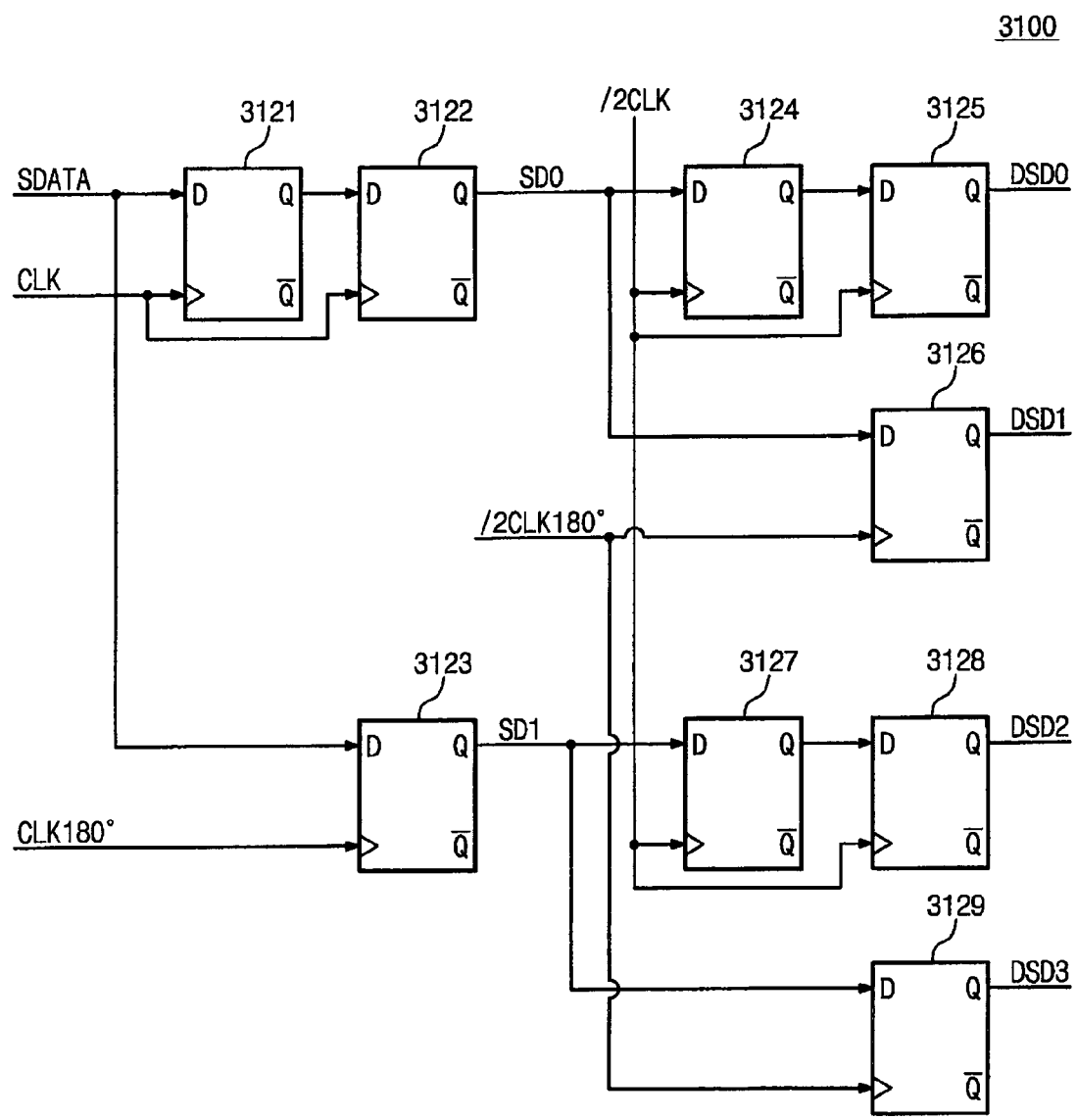
FIG. 5 is a block diagram further illustrating the first parallel converter of FIG. 4 in accordance with an embodiment of the invention.
Figure 6:
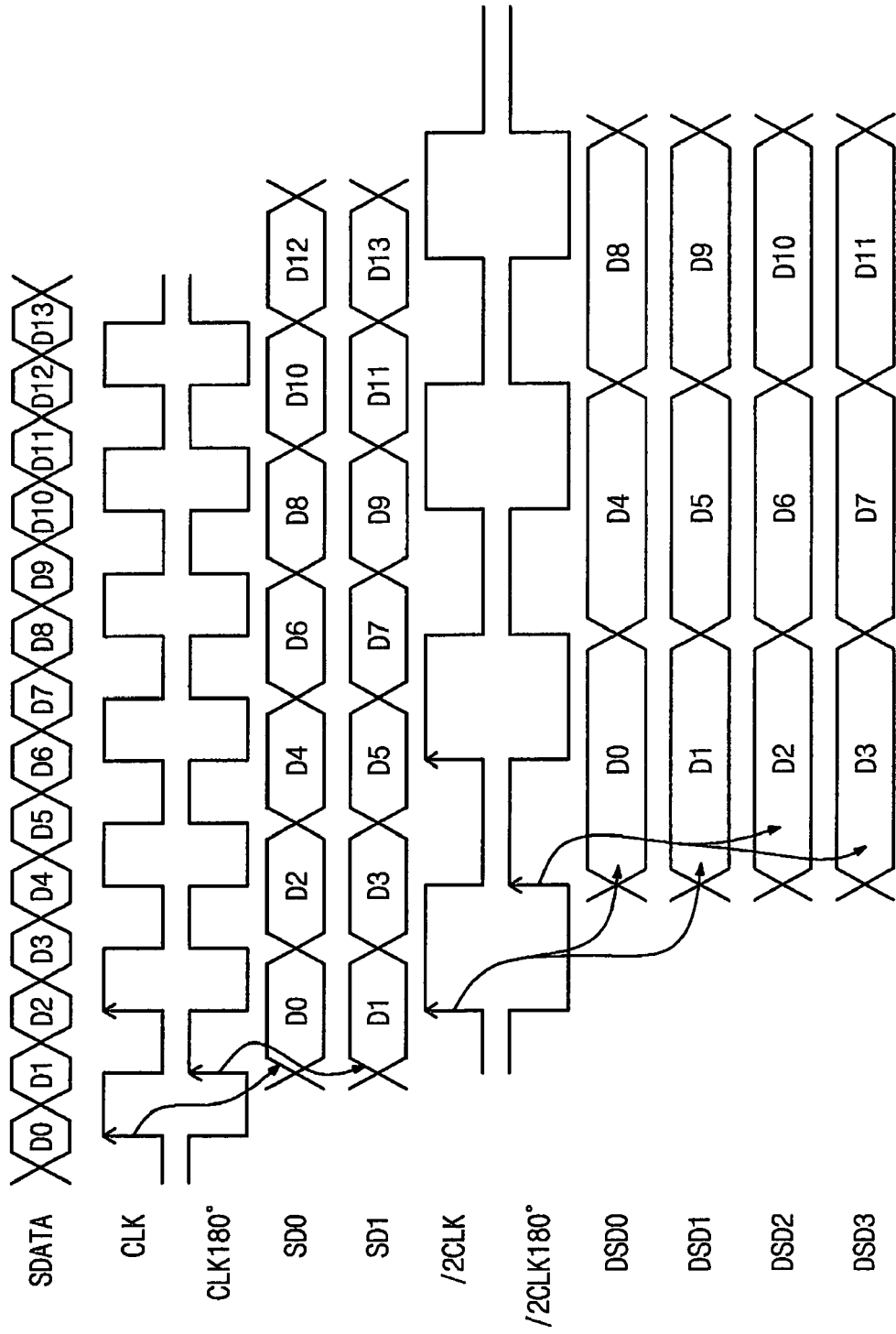
FIG. 6 is a timing diagram illustrating one possible approach to dividing serial data generated from the first parallel converter shown in FIG. 5.

FIG. 5 is a block diagram further illustrating one possible embodiment of first parallel converter 3100 from FIG. 4. Referring to FIG. 5, first parallel converter 3100 comprises flip-flops 3121~3129. FIG. 6 is a related timing diagram illustrating one possible approach to the division of the serial data SDATA into "P" serial data groups provided by first parallel converter 3100. In the illustrated example, P is equal to four and serial data groups DSD0~DSD3 are generated.

Referring to FIGS. 5 and 6, first parallel converter 3100 operates as follows. It is assumed that data is synchronously latched in flip-flops 3121~3129 on rising clock edges (hereafter denoted as "in sync with"). Flip-flop 3121 latches the applied serial data SDATA in sync with the main clock CLK. Flip-flop 3122 latches an output of flip-flop 3121 in sync with the main clock CLK. Flip-flop 3123 latches the applied serial data SDATA in sync with the complementary clock CLK180°. Thus, flip-flops 3122 and 3123 output the serial data SDATA as latched data SD0 and SD1 latched in relation to double cycle periods (i.e., periods including two rising clock edges) of the main clock CLK. Using this approach, flip-flops 3124~3129 may be configured in relation to the first clock signal /2CLK and is complement /2CLK180° along with latched serial data SD0 and SD1 to generate the P serial data groups DSD0~DSD3.

For convenience of description, it is assumed that the stream of 40 bits of serial data SDATA (D0~D39) applied to first parallel converter 3100 is converted into the four 10-bit serial data groups DSD0~DSD3 as shown in Table 1 below.

TABLE 1

| Converted 10-bit serial data | |
|---|---|
| DSD0 | <D0 D4 D8 D12 D16 D20 D24 D28 D32 D36> |
| DSD1 | <D1 D5 D9 D13 D17 D21 D25 D29 D33 D37> |
| DSD2 | <D2 D6 D10 D14 D18 D22 D26 D30 D34 D38> |
| DSD3 | <D3 D7 D11 D15 D19 D23 D27 D31 D35 D39> |

Continuing with this illustrative example, it is further assumed that the four demultiplexers (DEMUXs) 3202~3208 of second parallel converter 3200 respectively convert each 40-bit serial data group into 10-bit parallel data as shown in Table 2 below.

TABLE 2

| Converted parallel data | |
|---|---|
| 1st DEMUX 3202 | D0 D4 D8 D12 D16 D20 D24 D28 D32 D36 |
| 2nd DEMUX 3204 | D1 D5 D9 D13 D17 D21 D25 D29 D33 D37 |
| 3rd DEMUX 3206 | D2 D6 D10 D14 D18 D22 D26 D30 D34 D38 |
| 4th DEMUX 3208 | D3 D7 D11 D15 D19 D23 D27 D31 D35 D39 |

Figure 7:
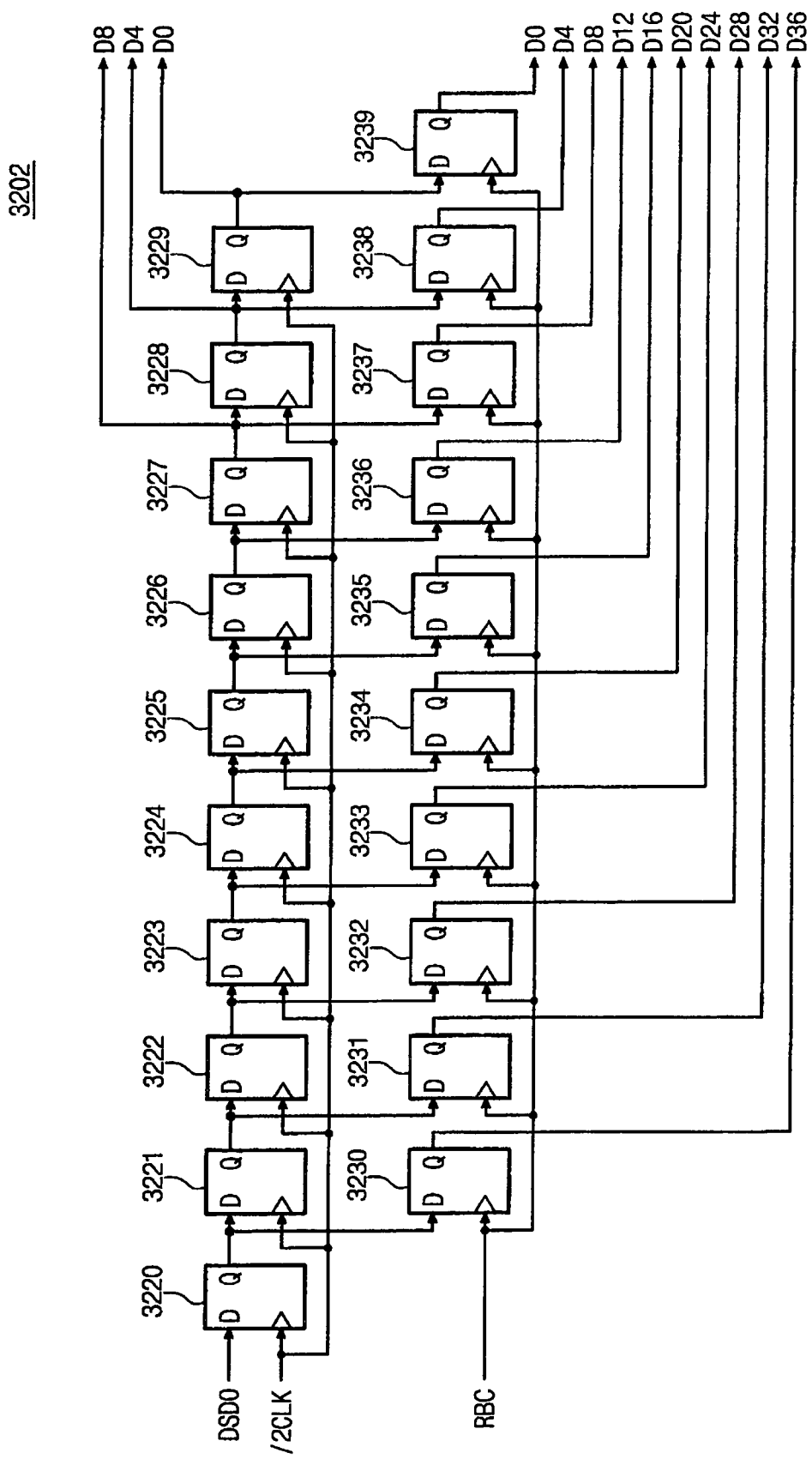
FIG. 7 is a block diagram is a block diagram showing a first demultiplexer of a second parallel converter in accordance with an embodiment of the present invention.

FIG. 7 is a block diagram further illustrating one of the plurality of demultiplexers (e.g., a first demultiplexer 3202) of second parallel converter 3200 according to one embodiment of the invention. Referring to FIG. 7, first demultiplexer 3202 comprises a first plurality of flip-flops 3220~3229 and a second plurality of flip-flops 3230~3239.

The first plurality of flip-flops 3220~3229 latch serial data from first serial data group DSD0 provided by first parallel converter 3100 in sync with the first clock /2CLK.

The second plurality of flip-flops 3230~3239 output the serial data applied to the first plurality of flip-flops 3220~3229 in sync with the second clock RBC. In this manner the second plurality of flip-flops 3230~3239 outputs the 10-bits of data (e.g., D0, D4, D8, D12, D16, D20, D24, D28, D32, and D36 in the working example) in parallel and in sync with the second clock RBC to selector 3600. Simultaneously, data bits D0, D4, and D8 from first flip-flops 3227, 3228, and 3229 are output to comma detector 3400.

Figure 8:
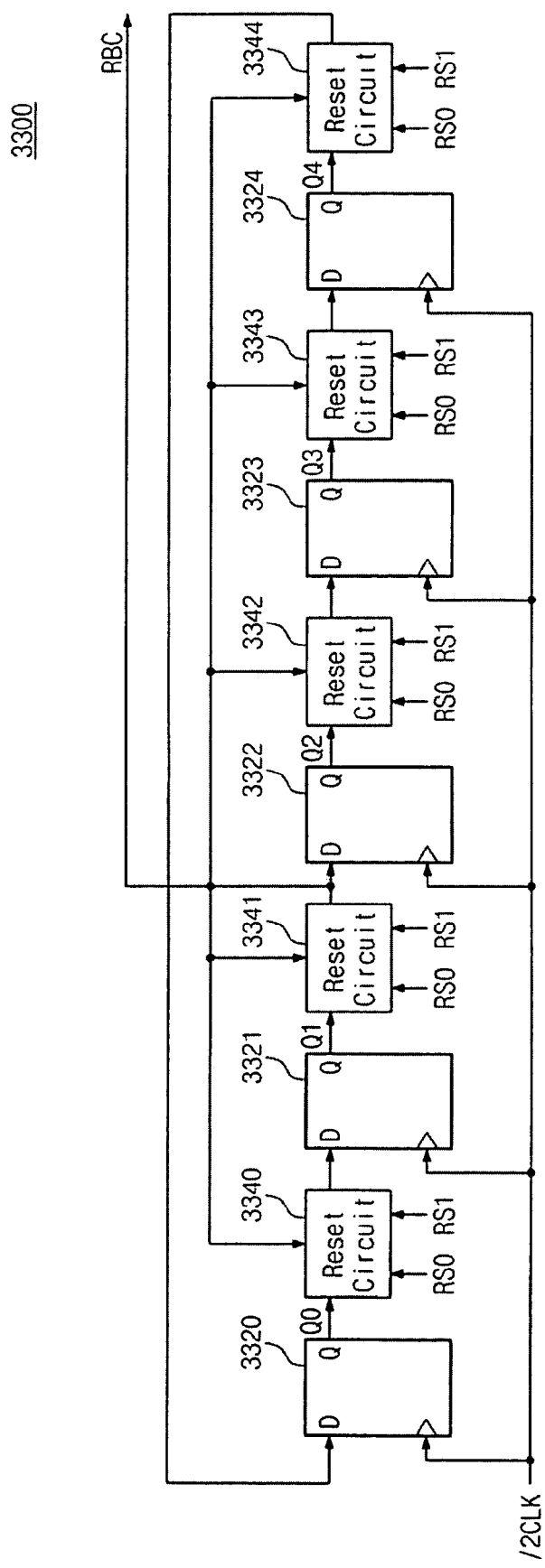
FIG. 8 is a block diagram further illustrating the clock frequency divider of FIG. 4 according one embodiment of the invention.

FIG. 8 is a block diagram further illustrating clock frequency divider 3300 according to one embodiment of the invention. Referring to FIG. 8, clock frequency divider 3300 comprises flip-flops 3320~3324 and corresponding reset circuits 3340~3344.

Clock frequency divider 3300 generates the second clock RBC by dividing the first clock /2CLK in ten frequency sections. Thus, clock frequency divider 3300 performs a 10-times frequency division using a conventionally understood circuit called a Johnson counter. Here, second clock RBC is one of output of the four possible outputs Q0~Q4 provided by the Johnson counter.

Clock frequency divider 3300 resets the second clock RBC in relation to first and second reset signals RS0 and RS1. In the illustrated embodiment, the first reset signal RS0 is derived in relation to detection signals CDET0~CDET3 provided by comma detector 3400. The second reset signal RS1 is derived by delaying the first reset signal RS0 by a predetermined delay period (e.g., 5 clock cycles). With this configuration, clock frequency divider 3300 according to the illustrated embodiment of the invention operates to remove glitches from the second clock RBC by resetting the second clock RBC using optimal combinations of the first and second reset signals RS0 and RS1.

Figure 9:
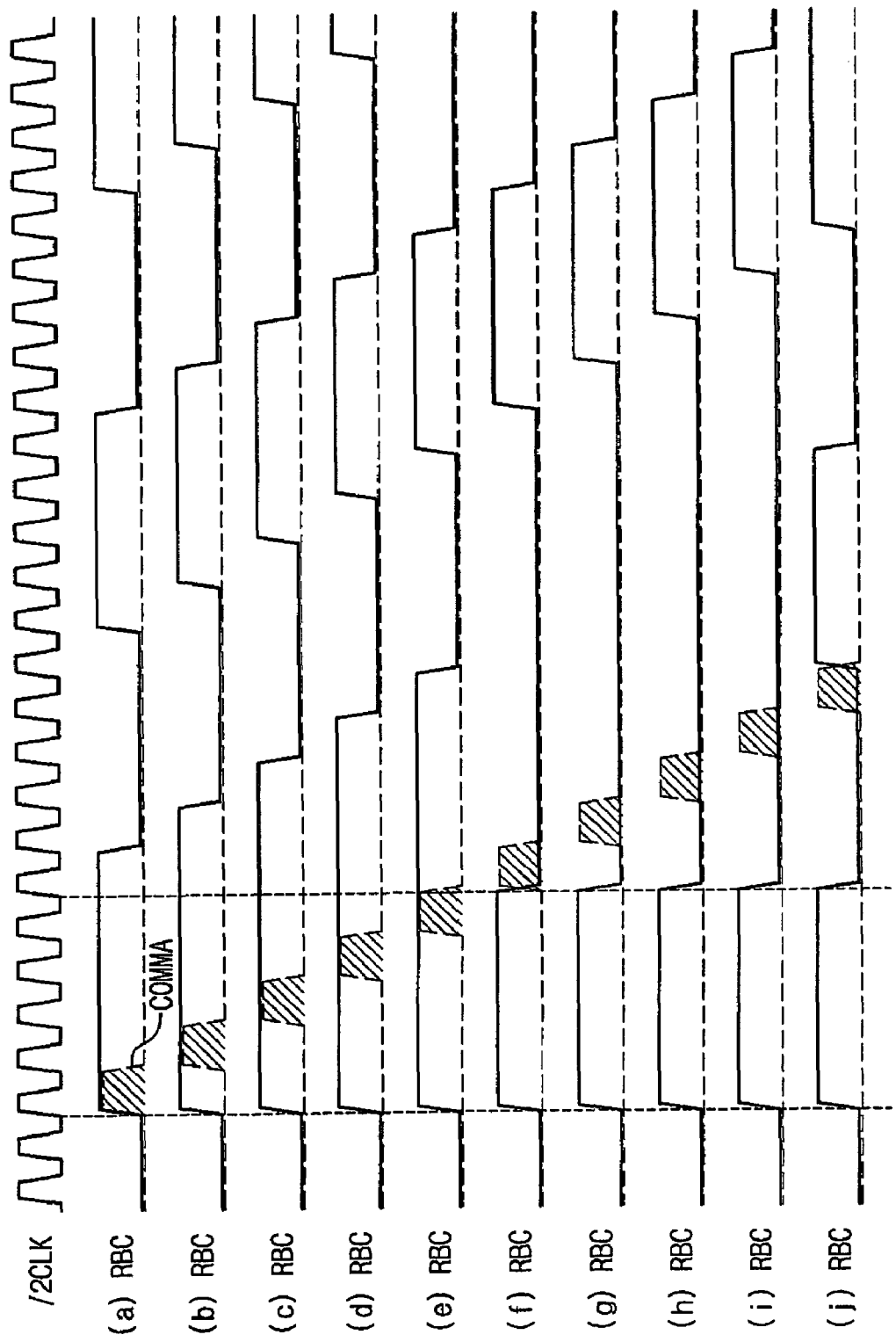
FIG. 9 is a timing diagram illustrating one possible method for resetting the clock frequency divider by comma detection in accordance with an embodiment of the invention.

FIG. 9 is a timing diagram illustrating one possible approach to the resetting operation of clock frequency divider 3300 by comma detection 3400 in accordance with an embodiment of the invention. Referring to FIG. 9, clock frequency divider 3300 is capable of operating in 10 timings periods in accordance with values of the second clock RBC. In the illustrated embodiment, clock frequency divider 330 controls reset of the second clock RBC in accordance with the logic state of the second clock RBC. This approach will be referred to hereafter as "the reset method of clock frequency divider 3300".

The reset method of clock frequency divider 3300 may be roughly characterized by three different modes related to the condition of the second clock RBC. First, if a comma is detected when the second clock RBC in a logical 'high' state, clock frequency divider 3300 resets the second clock RBC to a logical 'high' state in sync with the comma as shown in the steps (a)~(e) of FIG. 9. Second, if a comma is detected when the second clock RBC is in a logical 'low' state, clock frequency divider 3300 resets the second clock RBC to a logical 'low' state in sync with the comma as shown in the steps (f)~(i) of FIG. 9. Last, if the second clock RBC is transitioning from low to high (i.e., is characterized by a rising edge) just after detecting a comma, clock frequency divider 3300 resets the second clock RBC to a logical 'high' state in sync with the comma as shown in step (j) of FIG. 9. Thus, clock frequency divider 3300 may be operated such that potentially disruptive glitches are not generated in the second clock RBC.

Figure 10:
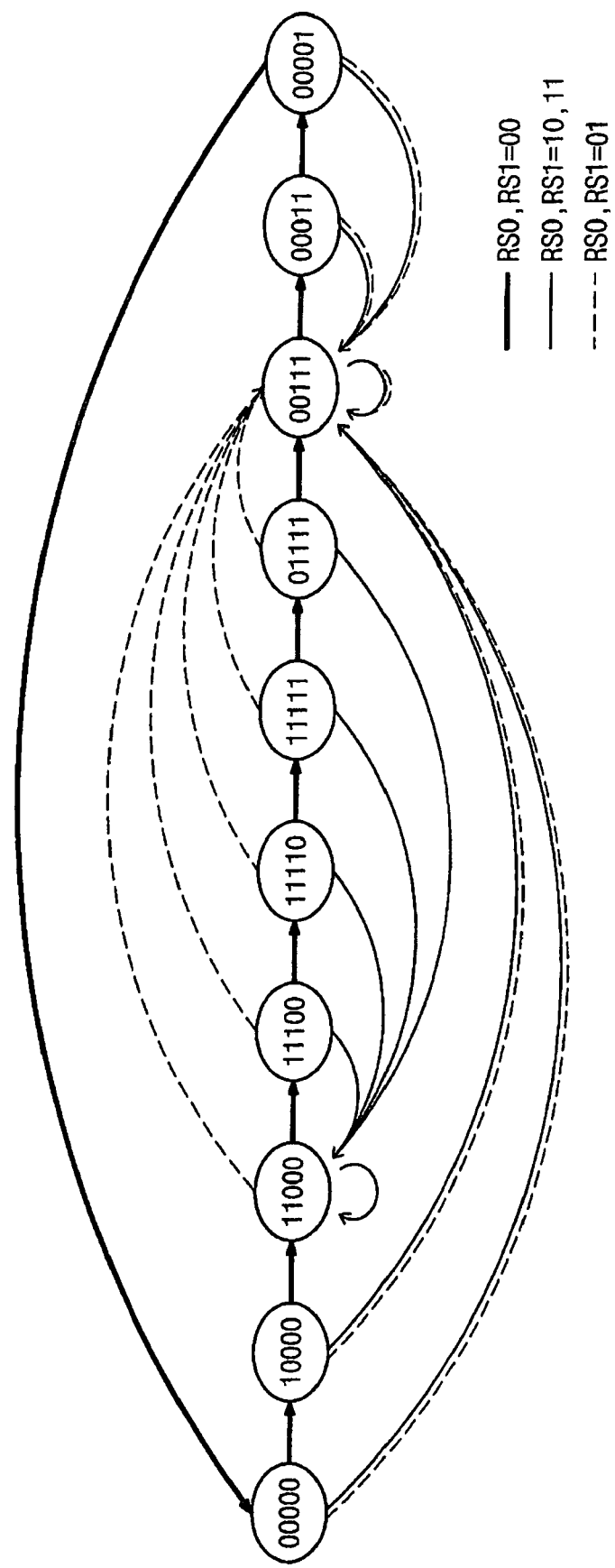
FIG. 10 is a state diagram further illustrating operation of the clock frequency divider according to an embodiment of the invention.

FIG. 10 is a state diagram associated with clock frequency divider 3300 described in relation to FIGS. 8 and 9 according to an embodiment of the invention. Referring to FIG. 10, clock frequency divider 3300 operates as follows.

If the first and second reset signals RS0 and RS1 are both 'low' when a comma is not detected, clock frequency divider 3300 operates as a normal Johnson counter.

If a comma is detected while the second clock RBC is 'high', clock frequency divider 3300 resets to state '11000' in response to the first reset signal RS0. In other words, reset circuits 3340~3344 output '1', '1', '0', '0', and '0', respectively.

Otherwise, if a comma is detected while the second clock RBC is 'low', clock frequency divider 3300 is reset to state '00111' in response to the first reset signal RS0. In other words, reset circuits 3340~3344 output '0', '0', '1', '1', and '1', respectively.

If the first reset signal RS0 is 'low' and the second reset signal RS1 is 'high', clock frequency divider 3300 is reset to state of '00111' in response to the second reset signal RS1. In other words, reset circuits 3340~3344 output '0', '0', '1', '1', and '1', respectively.

Clock frequency divider 3300 according to the illustrated embodiments of the invention precludes the generation of glitches on the second clock RBC by resetting the second clock RBC in response to the state of the second clock RBC and the comma detection signal.

Figure 11:
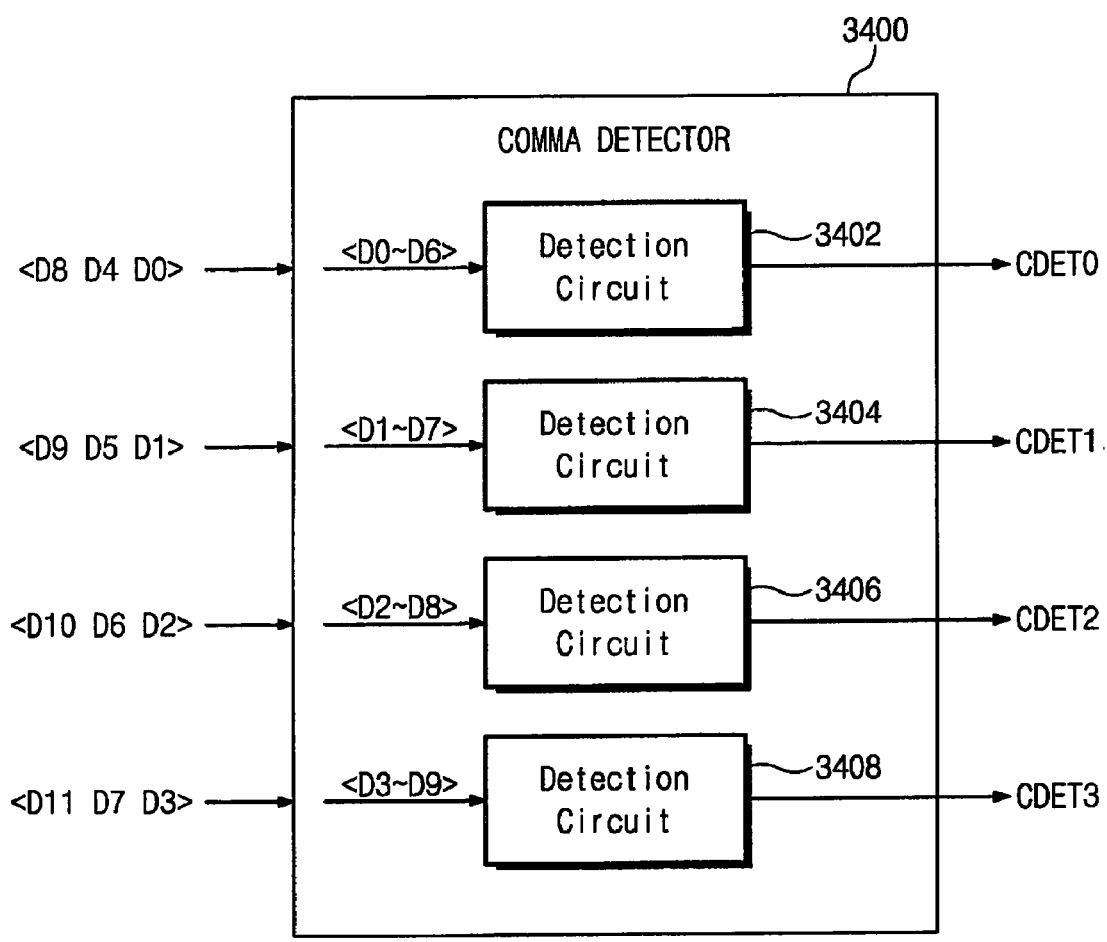
FIG. 11 is a block diagram further illustrating the comma detector of FIG. 4 according to an embodiment of the invention.

FIG. 11 is a block diagram further illustrating comma detector 3400 of FIG. 4 according to an embodiment of the invention. Referring to FIG. 11, comma detector 3400 comprises four (i.e., "P") detection circuits 3402~3408. Comma detector 3400 operates to detect a comma from the higher 3-bits of data apparent at demultiplexers 3202~3208 in relation to corresponding serial data groups. In the illustrated embodiment, comma detector 3400 receives 3-bit parallel data D0, D4, and D8 from first demultiplexer 3204, 3-bit parallel data D1, D5, and D9 from second demultiplexer 3206, 3-bit parallel data D2, D6, and D10 from third demultiplexer 3206, and 3-bit parallel data D3, D7, and D11 from fourth demultiplexer 3208. Thus, comma detector 3400 receives 12-bits of parallel data D0~D11 from second parallel converter 3200 and derives the detection signals CDET0~CDET3 by detecting a comma.

Figure 12:
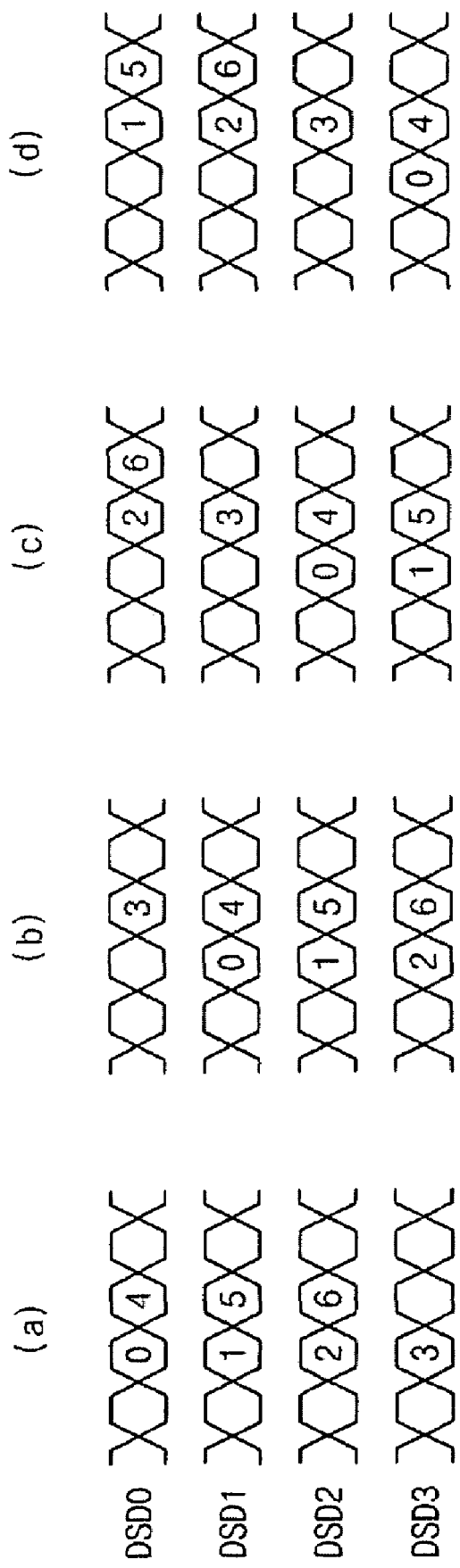
FIG. 12, including

As previously stated, the foregoing embodiments assume a comma comprising 7 bits. Thus, further assuming four serial data groups DSD0~DSD3 communicated from first parallel converter 3100, there will be four permissible comma patterns. FIG. 12 includes FIGS. 12A through 12D showing these four comma patterns. Of course these patterns arise form all of the foregoing assumptions and will vary with different data system design parameters.

Detection circuits 3402~3408 shown in FIG. 11 operate to detect a comma in accordance with the comma patterns shown in FIG. 12. First detection circuit 3402 detects the comma shown in FIG. 12A and generates the detection signal CDET0 by comparing and detecting data matches among the parallel data D0~D6. Second detection circuit 3404 detects the comma shown in FIG. 12B and generates the detection signal CDET1 by comparing and detecting data matches among the parallel data D1~D7. Third detection circuit 3406 detects the comma shown in FIG. 12C and generates the detection signal CDET2 by comparing and detecting data matches among the parallel data D2~D8. Fourth detection circuit 3408 detects the comma shown in FIG. 12D and generates the detection signal CDET3 by comparing and detecting data matches among the parallel data D3~D9.

Figure 13:
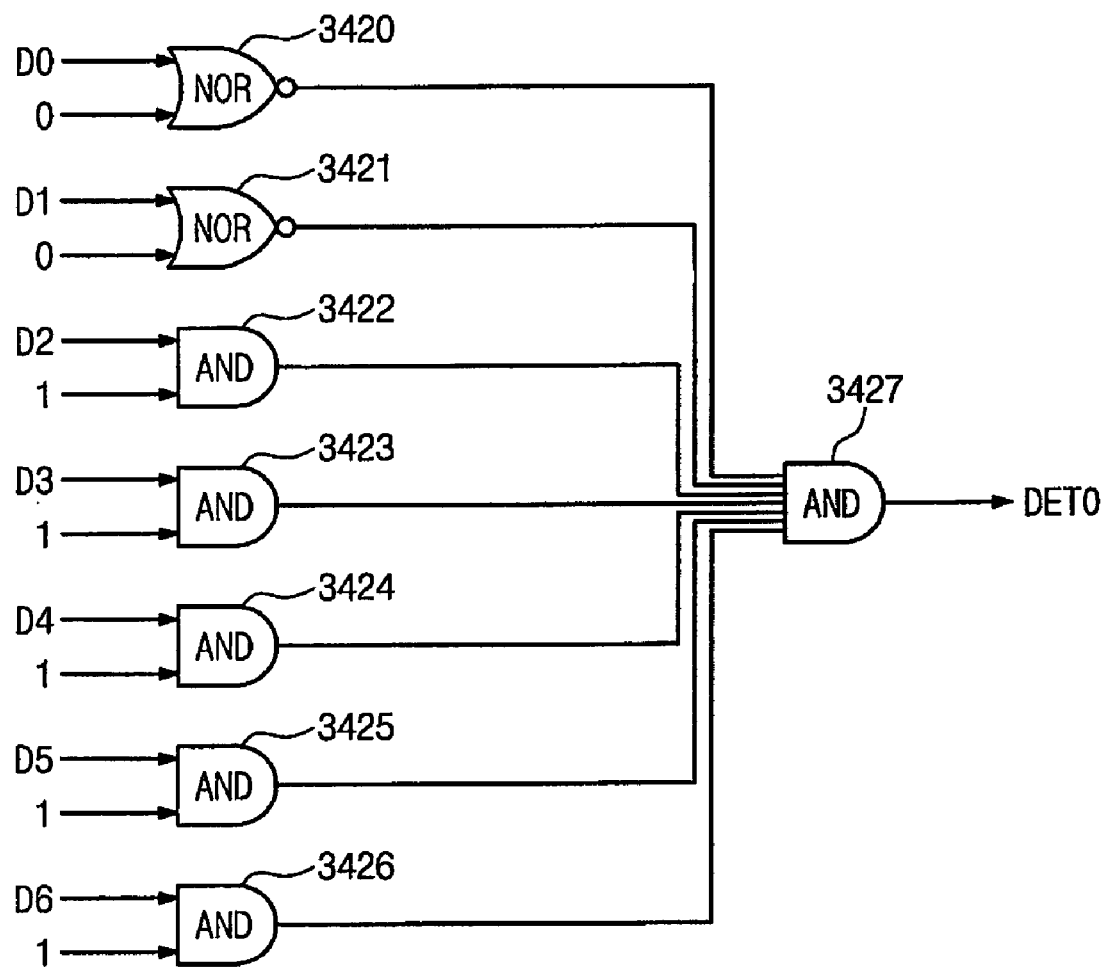
FIG. 13 is a logic gate circuit diagram of one possible first detection circuit according to an embodiment of the invention.

FIG. 13 is a circuit diagram further illustrating one possible embodiment for first detection circuit 3402 as an example of the other detection circuits configured for use with an embodiment of the invention. Referring to FIG. 13, first detection circuit 3402 comprises NOR logic circuits 3420 and 3421 and AND logic circuits 3422~3427. Here, it is assumed that the relevant a comma being detected is indicated by the data '0011111'.

First NOR logic circuit 3420 receives a first data bit D0 and a 'low' (i.e., a '0') and outputs the NORed result. Second NOR logic circuit 3421 receives data D1 and a 'low', and outputs the NORed result. First AND logic circuit 3422 receives data D2 and a 'high' (i.e., a '1') and outputs the ANDed result. Second through fifth AND logic circuits 3423-3426 operate similarly relative to their respective data bit inputs D3-D6. Finally AND logic circuit 3427 receives the output results from NOR logic circuits 3420 and 3421 and the AND logic circuits 3422~3426 and outputs the first comma detection signal DET0.

Comma detector 3400 in the illustrated embodiments of the invention detects a comma from the data bits D0~D11 provided by second parallel converter 3200 and generates corresponding comma detection signals CDET0~CDET3. The comma detection signals CDET0~CDET3 provided by comma detector 3400 are applied to clock frequency divider 3300 and encoder 3500 as shown, for example, in FIG. 4.

Table 3 shows output values corresponding to input values for encoder 3500 in accordance with the illustrated embodiment of the invention.

TABLE 3

| CDET0 | CDET1 | CDET2 | CDET3 | Encoder output | |
|---|---|---|---|---|---|
| | | | | S0 | S1 |
| 1 | 0 | 0 | 0 | 0 | 0 |
| 0 | 1 | 0 | 0 | 0 | 1 |
| 0 | 0 | 1 | 0 | 1 | 0 |
| 0 | 0 | 0 | 1 | 1 | 1 |

Encoder 3500 generates selection signals S0 and S1 in relation to comma detection signals CDET0~CDET3 provided by comma detector 3400. Referring to Table 3, when the first detection signal CDET0 is 'high', encoder 3500 generates a 'low' first selection signal S0 and a 'low' second selection signal S1. When the second detection signal CDET1 is 'high', encoder 3500 generates a 'low' first selection signal S0 and a 'high' second selection signal S1. When the third detection signal CDET2 is 'high', encoder 3500 generates a 'high' first selection signal S0 and a 'low' second selection signal S1. When the fourth detection signal CDET3 is 'high', encoder 3500 generates a 'high' first selection signal S0 and a 'high' second selection signal S1.

Figure 14:
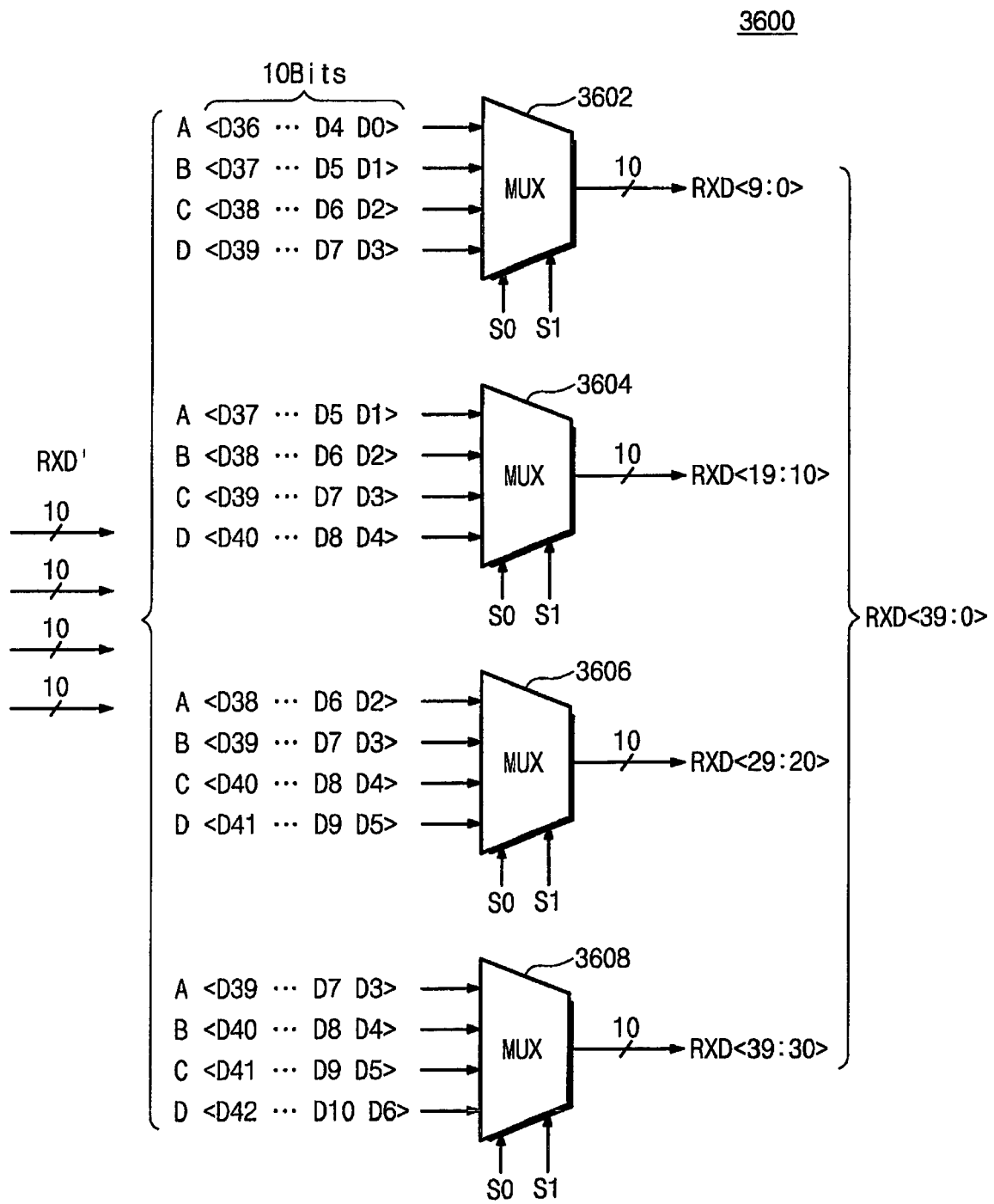
FIG. 14 is a block diagram further illustrating the selector of FIG. 4 according to one embodiment of the invention.

FIG. 14 is a block diagram further illustrating selector 3600 according to one embodiment of the invention. Referring to FIG. 14, selector 3600 comprises multiplexers (MUXs) 3602~3608. Selector 3600 outputs N-bit parallel data in relation to selection signals S0 and S1 provided by encoder 3500. Table 4 shows data patterns selected by the selection signals applied to the embodiment of FIG. 14.

TABLE 4

| S0 | S1 | Data selection |
|---|---|---|
| 0 | 0 | A |
| 0 | 1 | B |

TABLE 4-continued

| S0 | S1 | Data selection |
|----|----|----|
| 1  | 0  | C |
| 1  | 1  | D |

Referring to FIG. 14 and Table 4, selector 3600 is configured to output 40-bit parallel data having four patterns.

When the first selection signal S0 is 'low' and the second selection signals S1 is 'low', multiplexers 3602~3608 output data in the A pattern. Thus, selector 3600 outputs the 40-bit parallel data D0~D39.

When the first selection signal S0 is 'low' and the second selection signals S1 'high', multiplexers 3602~3608 output data in the B pattern. Thus, selector 3600 outputs the 40-bit parallel data D1~D40.

When the first selection signal S0 is 'high' and the second selection signal S1 is 'low', multiplexers 3602~3608 output data in the C pattern. Thus, selector 3600 outputs the 40-bit parallel data D2~D41.

When the first selection signal S0 is 'high' and the second selection signals S1 is 'high', multiplexers 3602~3608 output data in the D pattern. Thus, selector 3600 outputs the 40-bit parallel data D3~D42.

Thus, selector 3600 receives, in the illustrated example, 40 bits of parallel data from second parallel converter 3200 and is configured to output different data patterns that vary by 1 serial data bit in relation to the 40-bit serial data group. As shown in the embodiment illustrated in FIG. 14, first multiplexer 3602 receives four different groups of 10-bit parallel data, <D0, D4, ..., D36>, <D1, D5, D37>, <D2, D6, ..., D38>, and <D3, D7, ..., D39>. First multiplexer 3602 output a selective one of these four 10-bit parallel data groups, <D0, D4, ..., D36>, <D1, D5, D37>, <D2, D6, ..., D38>, and <D3, D7, ..., D39>, in accordance with a detected comma pattern. Selector 3600 is this configured to output aligned 40-bit parallel data in accordance with the comma pattern.

Yet, deserializer 300 according to various embodiments of the invention operates in such a manner that glitches are not generated in the recovery clock (i.e., the receiving-byte clock RBC). This is accomplished by resetting the recovery clock in accordance with its logical state and a corresponding comma detection.

As described above, a deserializer designed and implemented in accordance with an embodiment of the invention is able to operate with reduced data latency by aligning data while parallelizing it.

Moreover, the deserializer and related data deserializing method according to embodiments of the invention advantageously prevent the generation of glitches in parallel data by resetting the recovery clock in accordance with its state while converting serial data into the parallel data in sync with the recovery clock.

The above-disclosed subject matter is to be considered illustrative, and not restrictive, and the appended claims are intended to cover all such modifications, enhancements, and other embodiments, which fall within the scope of the invention. Thus, to the maximum extent allowed by law, the scope of the invention is to be determined by the broadest permissible interpretation of the following claims and their equivalents.

What is claimed is:

1. A deserializer comprising:
a first parallel converter configured to convert serial data into a plurality of serial data groups;
a second parallel converter configured to receive and convert the plurality of serial data groups into preliminary N-bit parallel data, where N is an integer greater than 1;
a comma detector configured to detect a comma associated with the plurality of serial data groups during conversion of the plurality of serial data group into the preliminary N-bit parallel data and generate corresponding comma detection signals, wherein the comma detector detects the comma from at least 3-bits of the N-bit parallel data; and
a data aligner configured to align the preliminary N-bit parallel data into N-bit parallel data in relation to the comma detection signals,
wherein the second parallel converter comprises a plurality of P demultiplexers, where P is an integer greater than 1, wherein each one of the plurality of P demultiplexers receives a serial data group selected from the plurality of serial data groups and converts the received serial data group into M-bit parallel data, where M is an integer less than N, and a combination of M-bit parallel data provided by the plurality of P demultiplexers forms the preliminary N-bit parallel data.

2. The deserializer of claim 1, wherein the first parallel converter receives a main clock and a complementary clock signal and generates a first clock in relation to the main clock, converts the serial data into the plurality of serial data groups in sync with the main clock and the complementary clock, and provides the plurality of serial data groups to the second parallel converter in sync with the first clock.

3. The deserializer of claim 2, further comprising:
a clock frequency divider receiving the first clock and generating a second clock,
wherein each one of the plurality of P demultiplexers converts the received serial data group into the M-bit parallel data in sync with the first clock and provides the M-bit parallel data as a portion of the preliminary N-bit parallel data in sync with the second clock.

4. The deserializer of claim 3, wherein the second clock has a period fractionally related to the period of the first clock and serves as a received byte clock provided by the deserializer with the N-bit parallel data.

5. The deserializer of claim 4, wherein the data aligner a plurality of M-bit parallel data from the second parallel converter and generates aligned N-bit parallel data in relation to comma detection signals.

6. The deserializer of claim 5, wherein the comma detector is configured to detect a comma from K-bit data, where K is an integer less than M, selected from each one of the plurality of M-bit parallel data.

7. The deserializer of claim 6, wherein the comma detector is configured to detect a plurality of comma detection patterns respectively associated with the plurality of M-bit parallel data provided by the second parallel converter.

8. The deserializer of claim 3, wherein the clock frequency divider resets the second clock in response to at least one of the comma detection signals.

9. The deserializer of claim 8, wherein the clock frequency divider resets the second clock further in response to the logical state of the second clock.

10. The deserializer claim 9, wherein the clock frequency divider comprises a Johnson counter comprising series connected flip-flops gated by the first clock signal and separated by reset circuits, wherein each reset circuit receives an output from a preceding flip-flop, and the Johnson counter generates the second clock signal.

11. The deserializer of claim 1, wherein the data aligner comprises:
- an encoder receiving the comma detection signals and generates a plurality of selection signals in response to the comma detection signals; and
- a selector receiving the preliminary N-bit parallel data and aligning the preliminary N-bit data into N-bit parallel data generated by the deserializer in relation to the plurality of selection signals.

12. The deserializer of claim 11, wherein the selector comprises a plurality of P multiplexers respectively receiving M-bit parallel data from one of the plurality of P demultiplexers, each one of the plurality of P multiplexers receiving and operating in response to the plurality of selection signals.

13. A method for deserializing data in a deserializer, comprising:
- converting serial data into a plurality of serial data groups;
- parallelizing the plurality of serial data groups to generate preliminary N-bit parallel data, where N is an integer greater than 1;
- detecting a comma related to the plurality of M-bit parallel data during parallelizing the plurality of serial data groups, wherein the comma is detected from at least 3-bits of the N-bit parallel data;
- aligning the preliminary N-bit parallel data to form N-bit parallel data generated by the deserializer while parallelizing the plurality of serial data groups in relation to the detected comma, wherein the preliminary N-bit parallel data is generated as a plurality of M-bit parallel data,
- detecting a comma related to the plurality of M-bit parallel data during parallelizing the plurality of serial data groups;
- aligning the preliminary N-bit parallel data in relation to the detected comma;
- generating a plurality of comma detection signals in relation to the detection of the comma;
- generating a plurality of selection signals in relation to the comma detection signals; and
- aligning the preliminary N-bit parallel data in relation to the detected comma by applying the preliminary N-bit parallel data to a plurality of multiplexers operated in relation to the plurality of selection signals.

14. A clock frequency divider adapted for use in a deserializer, and comprising:
- a series of connected flip-flops operating in sync with a first clock; and
- a plurality of reset circuits, wherein each one of the plurality of reset circuits is connected between preceding and flowing flip-flops in the series, such that each one of the plurality of reset circuits receives an output from the preceding flip-flop and passes the output of the preceding flip-flop to the following flip-flop,
- wherein a selected one of the plurality reset circuits generates a recovery clock applied in the deserializer, and
- wherein the plurality of reset circuits is reset in accordance with first and second reset signals related to a logical state of the recovery clock and the detection of a comma related to data being parallelized by the deserializer.

15. The clock frequency divider of claim 14, wherein when the first and second reset signals are both logical 'low' and a comma is not detected, the clock frequency divider operates as a normal Johnson counter.

16. The clock frequency divider of claim 14, wherein the recovery clock serves as a received byte clock generated by the deserializer in relation to the data being parallelized.

* * * * *